United States Patent
Koh et al.

(10) Patent No.: US 6,329,239 B2
(45) Date of Patent: *Dec. 11, 2001

(54) DRAM CELL FORMED ON AN INSULATING LAYER HAVING A VERTICAL CHANNEL AND A MANUFACTURING METHOD THEREOF

(75) Inventors: Yo Hwan Koh; Jin Hyeok Choi; Sang Won Kang, all of Kyoungki-do (KR)

(73) Assignee: Hyundai Electronics Industries Co., Ltd. (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/233,734

(22) Filed: Jan. 15, 1999

Related U.S. Application Data

(62) Division of application No. 08/955,157, filed on Oct. 21, 1997, now Pat. No. 5,888,864.

(30) Foreign Application Priority Data

Oct. 22, 1996 (KR) .................................................. 96-47513

(51) Int. Cl.$^7$ .............................................. H01L 21/8242
(52) U.S. Cl. ......................... 438/253; 438/197; 438/239; 438/386; 438/387; 257/296
(58) Field of Search ................................... 438/253, 239, 438/386–387, 197; 257/296

(56) References Cited

U.S. PATENT DOCUMENTS

| | | | |
|---|---|---|---|
| 5,001,526 | | 3/1991 | Gotou . |
| 5,004,705 | * | 4/1991 | Blackstone .......................... 437/225 |
| 5,389,559 | * | 2/1995 | Hsieh et al. ............................ 438/57 |
| 5,710,056 | * | 1/1998 | Hsu ........................................ 437/60 |
| 5,780,341 | * | 7/1998 | Ogura .................................... 438/259 |
| 5,888,864 | * | 3/1999 | Koh et al. ............................. 438/253 |
| 5,914,510 | * | 6/1999 | Hieda .................................... 257/301 |
| 6,045,625 | * | 4/2000 | Houston ............................... 148/33.3 |
| 6,074,892 | * | 6/2000 | Bowers et al. ......................... 438/57 |

FOREIGN PATENT DOCUMENTS 0282716   9/1988   (EP) .

* cited by examiner

Primary Examiner—Matthew Smith
Assistant Examiner—Granvill D. Lee, Jr.
(74) Attorney, Agent, or Firm—Blakely Sokoloff Taylor & Zafman

(57) ABSTRACT

A semiconductor memory device has a plurality of memory cells arranged in a matrix array, wherein each memory cell has a transistor and a capacitor and the transistor includes a vertical channel. The each memory cell includes a first junction region surrounded by the field oxide layer; a vertical channel including side surfaces, an upper portion and a lower portion, the lower portion of the vertical channel coupled to the first junction region; a second junction region coupled to the upper potion of the vertical channel; a gate electrode surrounding the side surfaces of the vertical channel and including a gate insulator located between the gate electrode and the side surfaces of the vertical channel; a charge storage electrode containing side surfaces, an upper portion and lower portion, the upper potion of the charge storage electrode coupled to the first junction region; a dielectric layer formed on the lower porion and the side surfaces of the charge storage electrode; and a plate electrode entirely surrounding the dielectric layer.

4 Claims, 3 Drawing Sheets

DRAM CELL FORMED ON AN INSULATING LAYER HAVING A VERTICAL CHANNEL AND A MANUFACTURING METHOD THEREOF

This is a divisional of application Ser. No. 08/955,157, now U.S. Pat. No. 5,888,864.

FIELD OF THE INVENTION

The present invention relates to a dynamic random access memory (hereinafter, abbreviated as DRAM) cell structure of a one-structure of a transistor and capacitor type and a manufacturing method thereof; and, more specifically, to a DRAM cell structure and a manufacturing method thereof which are capable of effectively reducing a cell area and simplifying the fabrication process with an sufficient cell capacitance to thereby obtain a highly integrated DRAM and the reliability thereof.

DESCRIPTION OF THE PRIOR ART

In a conventional dynamic random access memory, there are provided a plurality of memory cells arranged in a matrix array. Each of the memory cell includes a transistor and a capacitor. With increasing the capacity of memory, a cell structure of the DRAM device has a tendency to adopt a three-dimensional from rather than a planner form.

In order to increase the capacity of the memory by reducing a cell area, various devices and methods have been developed. For example, one of those devices is disclosed in an article by W. F. Richardson et al., "A Trench Transistor Cross Point DRAM Cell", *IEDM 85* (1985 *IEEE International Electron Device Meeting*), IEDM Tech. Dig. 1985, pp 714–717, which has one-transistor and a capacitor formed vertically in a deep trench. The capacitor is composed of a charge storage electrode and a surrounding substrate portion thereof. A dielectric film is sandwiched therebetween. The substrate portion surrounding the lower portion of the trench is used as the common capacitor electrode for all cells and is called a plate. The structure of the device utilizes the capacitor which is formed deep in the trench below the transistor. Therefore, the effective capacitance of the memory cell can be easily increased with increasing depth of the trench within a limited cell area, resulting a highly integrated DRAM. However, the above structure has problems such that, since a recessed oxide isolation and a drain region of cell are formed around an upper porion of a trench, a recessed oxide isolation requires a specified distance between neighboring drain regions, thus limiting an achievable minimum gap distance between cells. Further, if a short gap between cells is selected, a punch-through phenomenon between the drain regions may occur, thus resulting in a memory failure or information error.

Another improved structure for a DRAM is disclosed in U.S. Pat. No. 5,001,526 issued on Mar. 19, 1991, to Hiroshi Gotou, which includes memory cells formed on an insulating layer, each memory cell having a buried semiconductor pillar structure. The lower portion of the semiconductor pillar is used as a storage electrode of a capacitor and the upper porion thereof is used as active regions of a transistor. Specifically, the cell plate of the capacitor is formed around side surfaces of the lower portion of the semiconductor pillar, together with dielectric film therebwteen.

However, although the cell structure may successfully solves the above gap distance problem between cells, it is substantially difficult to obtain the effective capacitance of the memory cell because the lower portion of the charge storage electrode is directly coupled to the insulating layer and a polysilicon formed around the side surfaces thereof merely functions as the cell plate of the capacitor. It is, therefore, difficult to obtain a sufficient degree of reliability. Furthermore, since the pillar structure is formed by employing a complex epitaxial growth, it should be needed that a further simplified fabrication process is subjected to form DRAM cell structure having an effectively reduced cell area and an sufficient cell capacitance to thereby obtain a highly integrated DRAM.

SUMMARY OF THE INVENTION

It is, therefore, a primary object of the invention to provide a DRAM cell structure and a manufacturing method thereof which are capable of effectively reducing a cell area and simplifying the fabrication process with an sufficient cell capacitance to thereby obtain a highly integrated DRAM and its reliability.

In accordance with one aspect of the present invention, there is provided a method for preparing a semiconductor device having a plurality of memory cells in a matrix array, wherein each memory cell has a transistor and a capacitor and the transistor includes a vertical channel, which comprises the steps of: (a) forming a plurality of first junction regions on a first semiconductor wafer, each first junction region surrounded by a isolation layer; (b) forming a plurality of cylindrical charge storage electrodes, each cylindrical charge storage electrode containing side surfaces, an upper portion and a lower porion, and the upper portion of the cylindrical charge storage electrode coupled to a corresponding first junction region; (c) forming a dielectric layer over the side surfaces and lower surface of each of the cylindrical charge storage electrode; (d) forming a plate electrode surrounding an entire surface of the dielectric layer for said each cylindrical charge storage electrode; (e) forming a first insulation layer on the plate electrode by making a surface of the plate electrode flat; (f) bounding a second semiconductor wafer to the first insulation layer whereby the first semiconductor is supported by the second semiconductor; (g) forming a plurality of vertical channels by polishing and selectively etching the first semiconductor wafer having a predetermined thickness, each vertical channel coupled to the corresponding first junction region; (h) forming a gate electrode surrounding said each vertical channel, wherein the gate electrode has a gate insulator located between the gate electrode and said each vertical channel; (i) forming a second junction region on a upper surface of said each vertical channel; (j) forming a number of bit line by forming and selectively etching a second insulation layer on a resultant structure from the above steps and by forming and selectively etching a metal layer over the etched second insulation layer, each bit line coupled to a predetermined number of the second junction regions arranged on a line.

In accordance with another aspect of the present invention, there is provided a semiconductor memory device prepared by a method recited in claim 1 and having a plurality of memory cells arranged in a matrix array, wherein each memory cell has a transistor and a capacitor and the transistor includes a vertical channel, said each memory cell comprising: a first junction region surrounded by the field oxide layer; a vertical channel including side surfaces, an upper portion and a lower portion, the lower portion of the vertical channel coupled to the first junction region; a second junction region coupled to the upper potion of the vertical channel; a gate electrode surrounding the side surfaces of the vertical channel and including a gate insulator located between the gate electrode and the side surfaces of the vertical channel; a charge storage electrode containing side surfaces, an upper portion and lower portion, the upper potion of the charge storage electrode coupled to the first junction region; a dielectric layer formed on the lower porion and the side surfaces of the charge storage electrode; and a plate electrode entirely surrounding the dielectric layer.

BRIEF DESCRIPTION OF THE DRAWINGS

The above and other objects and features of the present invention will become apparent from the following description of preferred embodiments given in conjunction with the accompanying drawing, in which.

DETAILED DESCRIPTION OF THE PREFERRED EMBODIMENTS

Referring to FIGS. 1A to 1E, there are shown successive steps of a method, in accordance with the present invention, for fabricating the dynamic random access memory (hereinafter, referred as DRAM) cell structure. The DRAM, i.e, a semiconductor memory device has a plurality of memory cells in a matrix array, wherein each memory cell includes a transistor, e.g., a MOS transistor and a cell capacitor. Specifically, the MOS transistor contains a vertical channel.

Figure 1A:
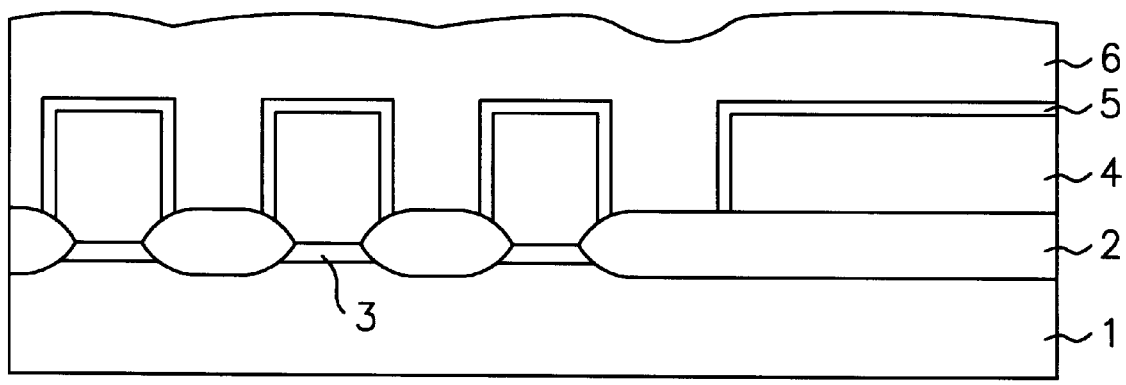
FIGS. 1A to 1E are illustrate cross-sectional views of DRAM cell structure fabricated by employing successive steps of a method in accordance with the present invention structure.

As shown in FIG. 1A, a field oxide layers, e.g., an isolation layer 2, is formed on a silicon wafer 1 in order to isolate each memory cell from others. Thereafter, a plurality of sources for MOS transistors are formed in each region 3 by employing an ion implantation, wherein each region 3 is surrounded by the field oxide layer 2 and serves to actuate corresponding cell capacitor. A polysilicon layer is then deposited on the surface of the wafer including the field oxide layer, and the source regions and a photo resistor pattern for defining charge storage electrodes are deposited thereon. The polysilicon layer is then selectively etched by using the photoresistor pattern as an etching mask to thereby form a plurality of charge storage electrodes 4 for the cell capacitors, wherein each charge storage electrode 4 has, e.g., a cylindrical shape including side surfaces, an upper portion and a lower potion, as shown in FIG. 1C, and is formed on the corresponding source region 3 to thereby couple the upper portion thereof to the corresponding source region 3. A dielectric layer 5 for each charge storage electrode is then formed over a corresponding charge storage electrode 4 to thereby surround the side surfaces; and the lower portion thereof and a polysilicon layer 6 are then deposited over the entire surface of an resultant structure to thereby form a common plate electrode 6 for the cell capacitor.

Figure 1B:
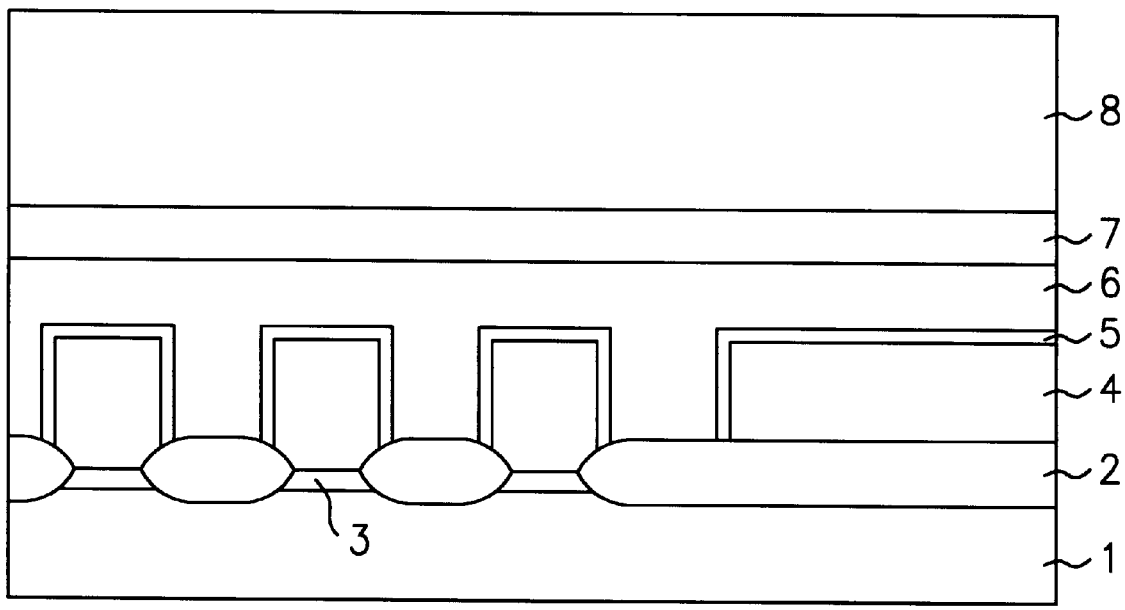
Figure 1C:
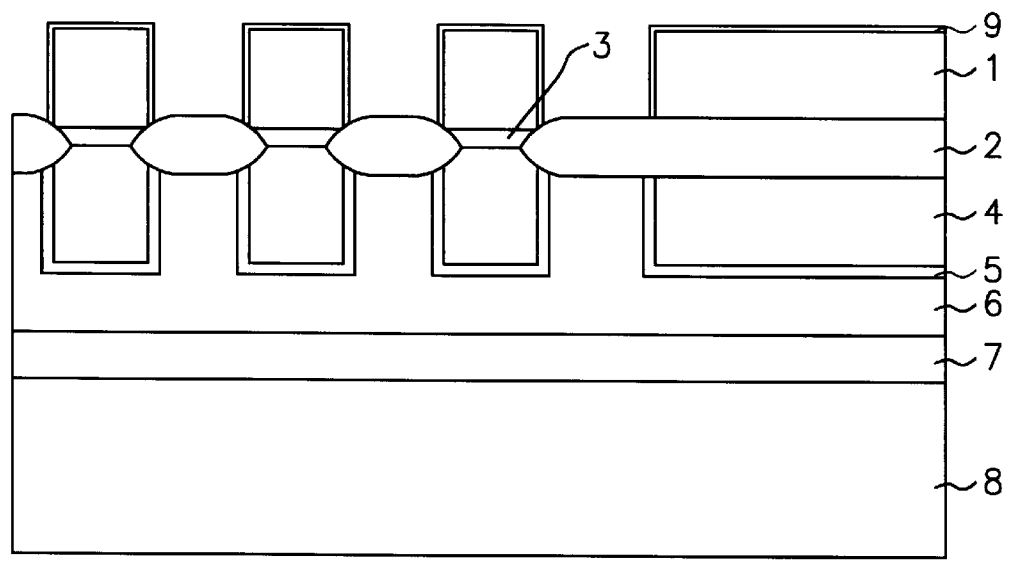

Next, as shown in FIG. 1B, the surface of the polysilicon layer for the plate electrode 6 is made flat by using a chemical mechanical polishing(CMP) and a field oxide layer, e.g., an insulation layer 7 is deposited over the flattened surface thereof. And then another silicon wafer 8 is bonded over the field oxide layer 7 through the use of a known silicon-on-insulator (SOI) technique. The silicon wafer 8 serves to protect a hole structure from certain physical forces.

Subsequently, as shown in FIG. 1C, the bounded structure is turned over so that the silicon wafer 8 is located at the bottom portion to thereby support the resultant structure from the above process. And then a surface portion of the silicon wafer 1 newly located at the top portion is removed by using the chemical mechanical polishing so that the silicon wafer has a thickness of about 0.1 um to 1.0 um. The polished silicon wafer is then selectively etched whereby a plurality of vertical channel regions 1a for the MOS transistors are formed, wherein each of the vertical channels 1a has a cylindrical shape having side surfaces, an upper portion and a lower portion, and the lower portion thereof is located on the corresponding source region 3, and a gate oxide 9 is formed over each of the vertical channel regions 1a.

Figure 1D:
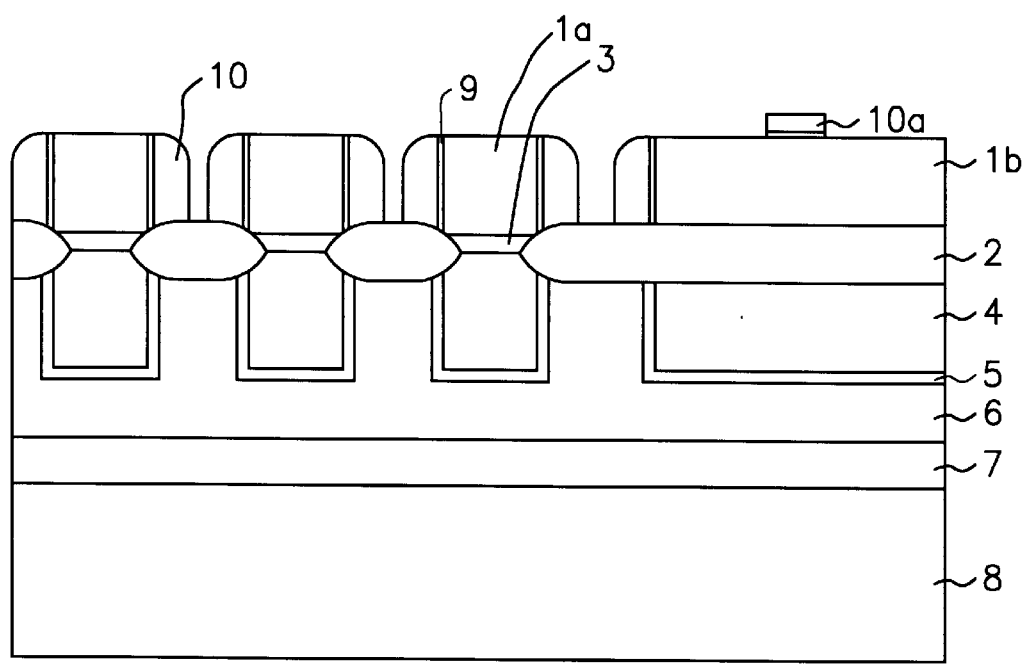

Next, as shown in FIG. 1D, a polysilicon layer is formed over the surface of the resultant structure from the above process and a gate electrode 10 for each vertical channel region 1a is formed by using an anisotropic etching, wherein each gate electrode and oxide surround the side surfaces corresponding vertical channel 1a. In the anisotropic etching process, a portions of the polysilicon layer, which is located on the surface of an active region 1b, is not removed by means of a photo register pattern whereby a vertical channel type gate electrode 10a is formed thereon. The active region 1b and the gate electrode 10a are constituting of a transistor for a peripheral circuitry.

Figure 1E:
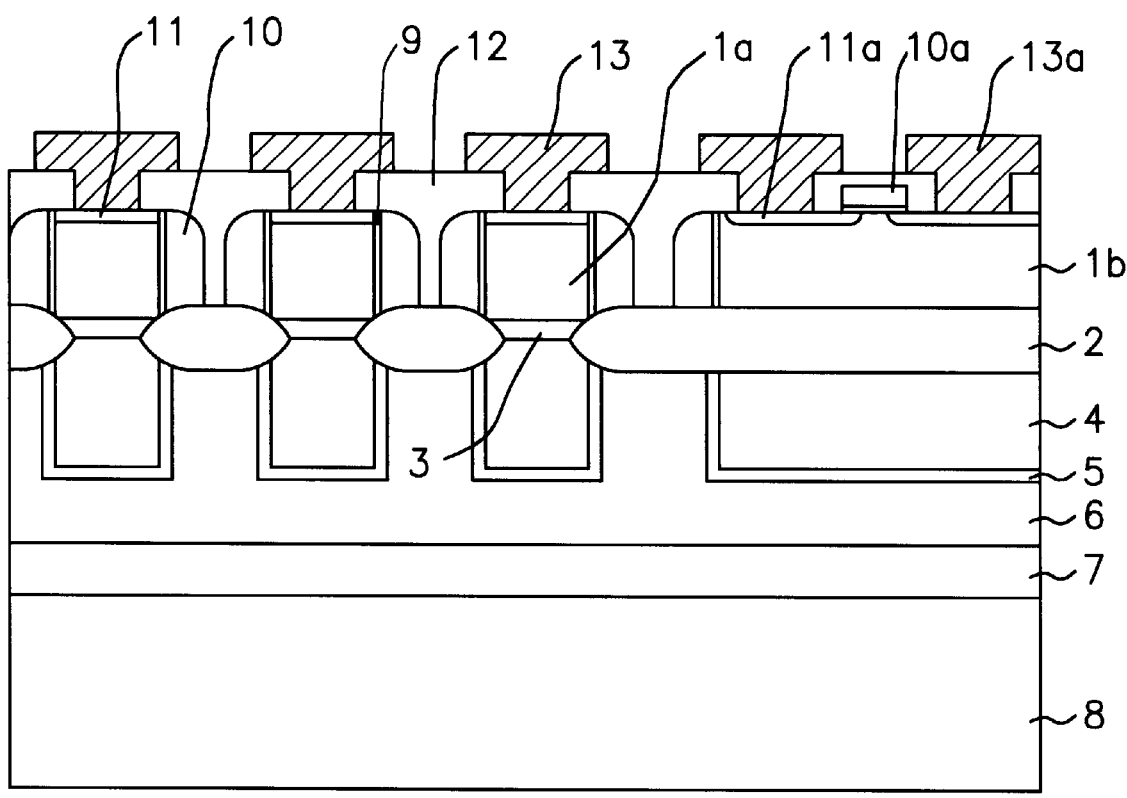

Subsequently, as shown in FIG. 1E, a drain region 11 and junction regions 11a are formed on each of the vertical channels 1a and the active region 1b, respectively, by employing the ion implantation. An insulation layer, i.e., oxide layer 12 is then formed over the surface of the resultant structure from the above process and is selectively removed by using a photolithography and etching so that the drain regions and the junction region for the peripheral circuitry is exposed. And then a metal layer is deposited over the surface of the resultant structure from the above process and is selectively etched to thereby form a number of bit lines 13 and electrodes 13a. Each of the bit line 13 is coupled to the surface of drain regions arranged in a line and the electrodes 13a for the peripheral circuitry are located on the junction regions 11a.

As demonstrated above, by using the inventive method, it is readily appreciated that the plate electrode for the cell capacitor effectively surrounds not only the side surface but also lower surface of each charge storage electrode therefor to sufficiently increase the capacitance thereof, thereby obtaining the reliable operation of the DRAM. Furthermore, a cell area is effectively reduced and the fabrication process is simplified with an sufficient cell capacitance to thereby easily obtain a highly integrated DRAM cell structure.

While the present invention has been shown and described with reference to the particular embodiments, it will be apparent to those skilled in the art that many changes and modifications may be made without departing from the spirit and scope of the invention as defined in the appended claims.

What is claimed is:

1. A semiconductor memory device having a plurality of memory cells arranged in a matrix array, wherein each memory cell has a transistor and a capacitor and the transistor includes a vertical channel layer, said each memory cell comprising:

a first junction region surrounded by the field oxide layer;

a vertical channel layer including side surfaces, a top surface and a bottom surface, the bottom surface of the vertical channel layer formed on the first junction region;

a second junction region formed on the top surface of the vertical channel layer;

a gate electrode formed on the field oxide layer and surrounding the side surfaces of the vertical channel layer and including a gate insulator located between the gate electrode and the side surface of the vertical channel layer;

a charge storage electrode including side surface, a top surface and a bottom surface, the top surface of the charge storage electrode formed under the first junction region;

a dielectric layer surrounding the side and bottom surfaces of the charge storage electrode;

a plate electrode entirely surrounding the dielectric layer;

a bit line contacted to the second junction region, wherein the bit line is overlapped with the charge storage electrode;

an insulator layer formed under the plate electrode; and a supporting substrate formed under the isolation layer.

2. The semiconductor memory device as recited in claim 1, wherein the first and the second junction region are a source and a drain of the transistor, respectively.

3. The semiconductor memory device as recited on claim 2, further comprising a plurality of word lines, each word line coupled to the gate electrode for each of the memory cell arranged on a line.

4. The semiconductor memory device as recited in claim 1, further comprising a horizontal channel type MOS transistor for a peripheral circuitry.

* * * * *